(12) United States Patent
Lopatin et al.

(10) Patent No.: US 6,630,741 B1
(45) Date of Patent: Oct. 7, 2003

(54) METHOD OF REDUCING ELECTROMIGRATION BY ORDERING ZINC-DOPING IN AN ELECTROPLATED COPPER-ZINC INTERCONNECT AND A SEMICONDUCTOR DEVICE THEREBY FORMED

(75) Inventors: Sergey Lopatin, Santa Clara, CA (US); Paul L. King, Mountain View, CA (US); Joffre F. Bernard, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 102 days.

(21) Appl. No.: 10/016,645

(22) Filed: Dec. 7, 2001

(51) Int. Cl.$^7$ .............. H01L 23/52; H01L 21/44
(52) U.S. Cl. .............. 257/762; 257/767; 438/687
(58) Field of Search .............. 257/741, 750, 257/751, 758, 762, 767; 438/597, 618, 622, 625, 627, 628, 629, 642, 643, 644, 652, 653, 654, 658, 674, 675, 687

(56) References Cited

U.S. PATENT DOCUMENTS

| 6,022,808 A | 2/2000 | Nogami et al. | |
| 6,197,181 B1 | 3/2001 | Chen | |
| 6,368,966 B1 * | 4/2002 | Krishnamoorthy et al. | . 438/687 |

FOREIGN PATENT DOCUMENTS

| JP | 2-50432 | * 2/1990 | ........ H01L/21/3205 |
| JP | 2-250924 | * 10/1990 | ............ C21D/9/04 |

OTHER PUBLICATIONS

Peter Van Zant, Microchip Fabrication: A Practical Guide to Semiconductor Processing, $3^{rd}$ Ed., p. 392, 397 (1997).

A. Krishnamoorthy, D. Duquette and S. Murarka, Electrochemical Codeposition and Electrical Characterization of a Copper–Zinc Alloy Metallization, in edited by Adricacos et al. Electrochem. Soc. Symp Proceedings vol. 99–9, May 3–6, Seattle, p. 212.

J. Cunningham, Using Electrochemistry to Improve Copper Interconnect, in J. Semiconductor International, Spring 2000 (May).

Lin Lin Chen and T. Titzdorf, "ECD Seed Layer for in–Laid Copper Metallization" in edited by Andricacos et. al., Electrochem Society Proceedings vol. 99–9, Seattle Symphony May 3–6, 1999, p. 122.

* cited by examiner

*Primary Examiner*—Evan Pert
(74) *Attorney, Agent, or Firm*—LaRiviere, Grubman & Payne, LLP

(57) ABSTRACT

A method of reducing electromigration in a graded reduced-oxygen dual-inlaid copper interconnect line by filling a via with a graded Cu-rich Cu—Zn alloy fill electroplated on a Cu surface using a stable chemical solution, and by controlling and ordering the Zn-doping thereof, which also improves interconnect reliability and corrosion resistance, and a semiconductor device thereby formed. The method involves using a graded reduced-oxygen Cu—Zn alloy as fill for the via in forming the dual-inlaid interconnect structure. The graded alloy fill is formed by electroplating, while varying electroplating parameters, the Cu surface in a unique chemical solution containing salts of Zn and Cu, their complexing agents, a pH adjuster, and surfactants, thereby electroplating the graded fill on the Cu surface; and annealing the electroplated graded Cu—Zn alloy fill; and planarizing the Cu—Zn alloy fill, thereby forming the graded reduced-oxygen dual-inlaid copper interconnect line.

20 Claims, 5 Drawing Sheets

US 6,630,741 B1

Figure 1:
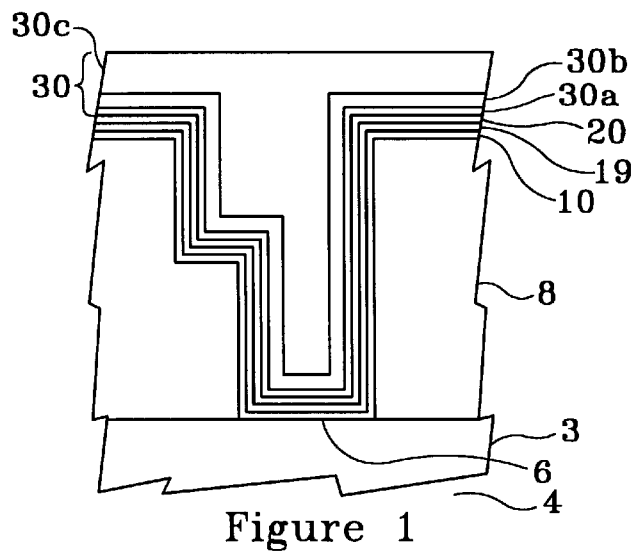

METHOD OF REDUCING ELECTROMIGRATION BY ORDERING ZINC-DOPING IN AN ELECTROPLATED COPPER-ZINC INTERCONNECT AND A SEMICONDUCTOR DEVICE THEREBY FORMED

CROSS-REFERENCE TO RELATED APPLICATION(S)

This application is also related to the following concurrently filed and commonly assigned applications:
(1) U.S. Ser. No. 10/081,074, entitled "Chemical Solution for Electroplating a Copper-Zinc Alloy Thin Film," filed Feb. 21, 2002;
(2) U.S. Ser. No. 10/082,432, entitled "Method of Electroplating a Copper-Zinc Alloy Thin Film on a Copper Surface Using a Chemical Solution and a Semiconductor Device thereby Formed," filed Feb. 22, 2002;
(3) U.S. Ser. No. 10/082,433, entitled "Method of Controlling Zinc-Doping in a Copper-Zinc Alloy Thin Film Electroplated on a Copper Surface and a Semiconductor Device thereby Formed," filed Feb. 22, 2002;
(4) U.S. Ser. No. 10/083,809, entitled "Method of Reducing Electromigration in a Copper Line by Electroplating an Interim Copper-Zinc Alloy Thin Film on a Copper Surface and a Semiconductor Device thereby Formed," filed Feb. 26, 2002;
(5) U.S. Ser. No. 10/084,563, entitled "Method of Reducing Electromigration in a Copper Line by Zinc-Doping of a Copper Surface from an Electroplated Copper-Zinc Alloy Thin Film and a Semiconductor Device thereby Formed," filed Feb. 26, 2002; and
(6) U.S. Ser. No. 10/016,410 entitled "Method of Reducing Electromigration in a Copper Line by Zinc-Doping of a Copper Surface from an Electroplated Copper-zinc Alloy Thin Film and a Semiconductor Device thereby Formed," filed Dec. 17, 2001, now U.S. Pat. No. 6,515,368.

FIELD OF THE INVENTION

The present invention relates to semiconductor devices and their methods of fabrication. More particularly, the present invention relates to the processing of copper interconnect material and the resultant device utilizing the same. Even more particularly, the present invention relates to reducing electromigration in copper interconnect lines by doping their surfaces with a barrier material using wet chemical methods.

BACKGROUND OF THE INVENTION

Currently, the semiconductor industry is demanding faster and denser devices (e.g., 0.05-$\mu$m to 0.25-$\mu$m) which implies an ongoing need for low resistance metallization. Such need has sparked research into resistance reduction through the use of barrier metals, stacks, and refractory metals. Despite aluminum's (Al) adequate resistance, other Al properties render it less desirable as a candidate for these higher density devices, especially with respect to its deposition into plug regions having a high aspect ratio cross-sectional area. Thus, research into the use of copper as an interconnect material has been revisited, copper being advantageous as a superior electrical conductor, providing better wettability, providing adequate electromigration resistance, and permitting lower depositional temperatures. The copper (Cu) interconnect material may be deposited by chemical vapor deposition (CVD), plasma-enhanced chemical vapor deposition (PECVD), sputtering, electroless plating, and electrolytic plating.

However, some disadvantages of using Cu as an interconnect material include etching problems, corrosion, and diffusion into silicon.[1] These problems have instigated further research into the formulation of barrier materials for preventing electromigration in both Al and Cu interconnect lines. In response to electromigration concerns relating to the fabrication of semiconductor devices particularly having aluminum-copper alloy interconnect lines, the industry has been investigating the use of various barrier materials such as titanium-tungsten (TiW) and titanium nitride (TiN) layers as well as refractory metals such as titanium (Ti), tungsten (W), tantalum (Ta), molybdenum (Mo), and their silicides.[2] Although the foregoing materials are adequate for Al interconnects and Al—Cu alloy interconnects, they have not been entirely effective with respect to all-Cu interconnects. Further, though CVD and PECVD have been conventionally used for depositing secondary metal(s) on a primary metal interconnect surface, neither technique provides a cost-effective method of forming a copper-zinc alloy on a Cu interconnect surface. Therefore, a need exists for a low cost and high throughput method of reducing electromigration in a dual-inlaid copper interconnect line by filling a via with a graded copper-zinc (Cu—Zn) alloy electroplated on a copper (Cu) surface from a stable chemical solution, and by controlling and ordering the Zn-doping thereof, which also improves interconnect reliability and corrosion resistance.

[1] Peter Van Zant, Microchip Fabrication: A Practical Guide to Semiconductor Processing, $3^{rd}$ Ed., p. 397 (1997).
[2] Id., at 392.

BRIEF SUMMARY OF THE INVENTION

Accordingly, the present invention provides a method of reducing electromigration in a dual-inlaid copper interconnect line by filling a via with a graded Cu-rich (e.g., approximately 99.8 at. % to approximately 98 at. %) copper-zinc (Cu—Zn) alloy electroplated on a copper (Cu) surface from a stable chemical solution, and by controlling and ordering the Zn-doping thereof (e.g., approximately 0 at. % to approximately 4 at. %, preferably approximately 0 at. % to approximately 1 at. %), which also improves interconnect reliability and corrosion resistance, and a semiconductor device thereby formed. The present method involves filling the via by electroplating the Cu surface, such as a Cu—Zn alloy seed layer and a partial thickness plated Cu layer, into a unique nontoxic aqueous chemical electroplating solution containing salts of zinc (Zn) and copper (Cu), their complexing agents, a pH adjuster, and surfactants, thereby forming an electroplated Cu—Zn alloy fill having some degree of oxygen (O) concentration, wherein the Zn-doping is controllable by varying the electroplating conditions; and annealing the Cu—Zn alloy fill formed on the Cu surface in an environment such as vacuum, nitrogen ($N_2$), hydrogen ($H_2$), formine ($N_2H_2$), or mixtures thereof for reducing the O-concentration in the alloy fill, for modifying the grain structure of the graded Cu—Zn alloy fill as well as of the underlying Cu surface, and for forming a mixed Cu—Zn/Cu interface, thereby forming the dual-inlaid interconnect structure. The present invention further provides a particular electroplating method which controls the parameters of Zn concentration, pH, temperature, and time in order to form a graded reduced-oxygen copper-zinc (Cu—Zn) alloy fill on a cathode-wafer surface such as a copper (Cu) surface for reducing electromigration in the device by decreasing the drift velocity therein which decreases the Cu migration rate in addition to decreasing the void formation rate.

More specifically, the present invention provides a method of fabricating a semiconductor device, having a graded reduced-oxygen copper-zinc (Cu—Zn) alloy fill formed on a copper (Cu) surface by electroplating the Cu surface in a chemical solution, generally comprising the steps of: providing a semiconductor substrate having a Cu surface (e.g., a Cu—Zn alloy seed layer), the Cu surface having been formed by CVD, PVD, PECVD, ALD, or electroplating, an optional barrier layer, and an optional underlayer formed in a via; providing a chemical solution; immersing the Cu surface in the chemical solution, thereby forming a graded Cu—Zn alloy fill on the Cu surface in the via, wherein the electroplating parameters such as current density, solution flow rate (hydrodynamic conditions), temperature, and spacing between the anode and the wafer (current density is variable by mechanical adjustment) are varied in situ to effect the desired Zn-content gradient in the alloy fill; rinsing the graded Cu—Zn alloy fill in a solvent; drying the graded Cu—Zn alloy fill under a gaseous flow; annealing the graded Cu—Zn alloy fill formed on the Cu surface, thereby forming a graded reduced-oxygen Cu—Zn alloy fill; planarizing the graded reduced-oxygen Cu—Zn alloy fill, the Cu surface, the optional barrier layer, and the optional underlayer, thereby completing formation of a Cu—Zn alloy dual-inlaid interconnect structure; and completing formation of the semiconductor device.

By electroplating this graded Cu—Zn alloy fill in the via and on the cathode-wafer surface, such as a Cu surface (e.g., Cu—Zn alloy seed layer), using a stable chemical solution in the prescribed concentration ranges and by subsequently annealing the graded Cu—Zn alloy fill electroplated on the Cu surface, the present invention improves Cu interconnect reliability, enhances electromigration resistance, improves corrosion resistance, and reduces manufacturing costs. In particular, the present invention chemical solution is advantageous in that it facilitates formation of an acceptable graded Cu—Zn alloy fill over a wide range of bath compositions while the subsequent annealing step removes undesirable oxygen impurities from the formed alloy fill. The desirable Zn content gradient in the graded Cu—Zn alloy fill, preferably in a range of approximately 0 at. % to approximately 4 at. %, preferably in a range of approximately 0 at. % to approximately 1 at. %, determined by X-Ray Photoelectron Spectroscopy (XPS) or Auger Electron Spectroscopy (AES), is controllable by varying the electroplating conditions and/or the bath composition. By so controlling and ordering the Zn-doping, the present method Zn content gradient better balances high electromigration performance against low resistivity requirements. Additionally, the Cu surface (e.g., Cu—Zn alloy seed layer), being formed by a technique such as electroless deposition, ion metal plasma (IMP), self-ionized plasma (SIP), hollow cathode magnetron (HCM), chemical vapor deposition (CVD), and atomic layer deposition (ALD), is enhanced by the graded Cu—Zn alloy fill and is prevented from etching by the high pH value (i.e., basic) of the chemical solution from which the graded alloy fill is formed.

Further advantages arise from the present invention's superior fill-characteristics. The present Cu—Zn electroplating solution facilitates better filling of the via on an interconnect, especially for feature sizes in a dimensional range of approximately 0.2 $\mu$m to approximately 0.05 $\mu$m, thereby lowering the resistance of the formed Cu—Zn alloy fill (e.g., in a resistance range of approximately 2.2 $\mu\Omega$·cm to approximately 2.5 $\mu\Omega$·cm for approximately 1 at. % Zn content in a Cu—Zn alloy fill, as deposited). Further, the filling capability is enhanced by three beneficial characteristics of the present invention: (1) the instant chemical solution does not etch copper or a Cu—Zn alloy seed layer;

(2) the introduction of Zn into the graded alloy fill as well as onto the Cu interconnect improves both step coverage and nucleation; and (3) a variety of organic additives, such as polyethylene glycol (PEG), organo-disulfides, and organo-chlorides, are compatible and may be included in the instant chemical solution for further enhancing the fill profile and grain structure. The present Cu—Zn electroplating solution provides a desirably low Zn content gradient in a Cu alloy interconnect (e.g., in a concentration range of approximately 0.2 at. % to approximately 1.0 at. %) which also imparts (1) a de minimis increase in electrical resistance as well as (2) a maximum improvement in electromigration resistance. The present chemical solution can also provide a desirably low Zn content gradient in a Cu film, wherein the Zn content gradient may be ordered by varying the deposition parameters as well as by modifying the bath composition.

BRIEF DESCRIPTION OF THE DRAWING(S)

For a better understanding of the present invention, reference is made to the below-referenced accompanying drawings. Reference numbers refer to the same or equivalent parts of the present invention throughout the several figures of the drawings.

(1) FIG. 1 is a cross-sectional view of a Cu interconnect line formed on a semiconductor substrate and acting as the bottom portion of a via, the via sidewalls comprising at least one low dielectric constant layer, the via having an optional barrier layer formed therein, an optional underlayer formed on the optional barrier layer, and a Cu surface formed on the optional underlayer, and a graded Cu—Zn alloy fill formed in the via and on the Cu surface, in accordance with the present invention.

Figure 2:
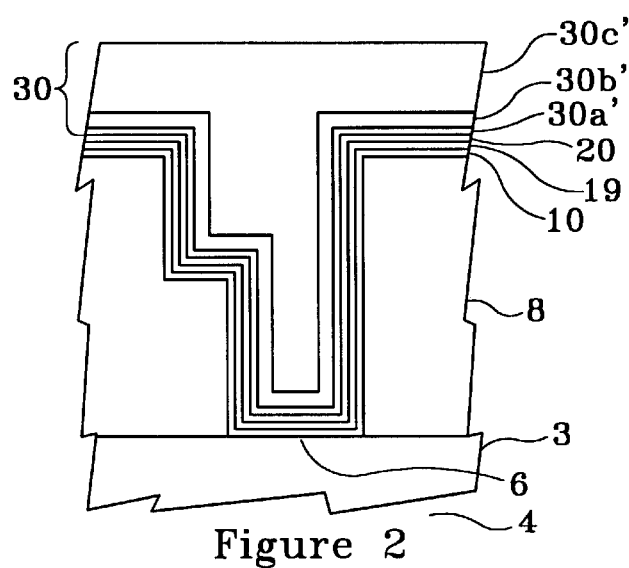

(2) FIG. 2 is a cross-sectional view of the features as shown in FIG. 1, wherein the graded Cu—Zn alloy fill has been annealed, in accordance with the present invention.

Figure 3:
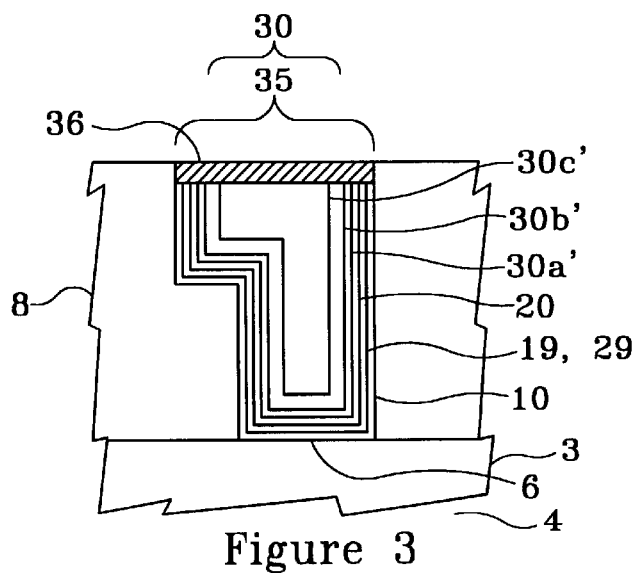

(3) FIG. 3 is a cross-sectional view of the features as shown in FIG. 2, further having been planarized to form a graded Cu—Zn alloy fill dual-inlaid interconnect structure, in accordance with the present invention.

Figure 4:
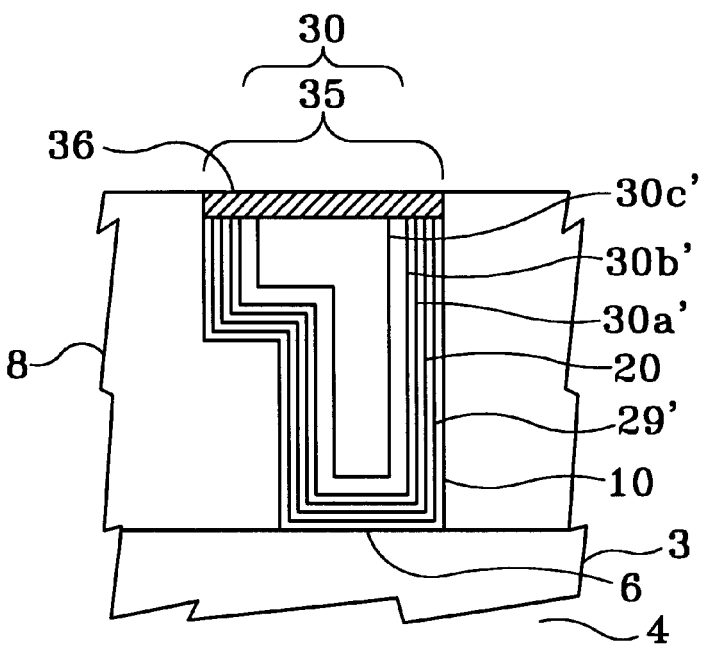

(4) FIG. 4 is a cross-sectional view of the features as shown in FIG. 3, wherein a mixed layer comprises the optional underlayer and the Cu—Zn—Sn—Pd alloy layer, in accordance with the present invention.

Figure 5:
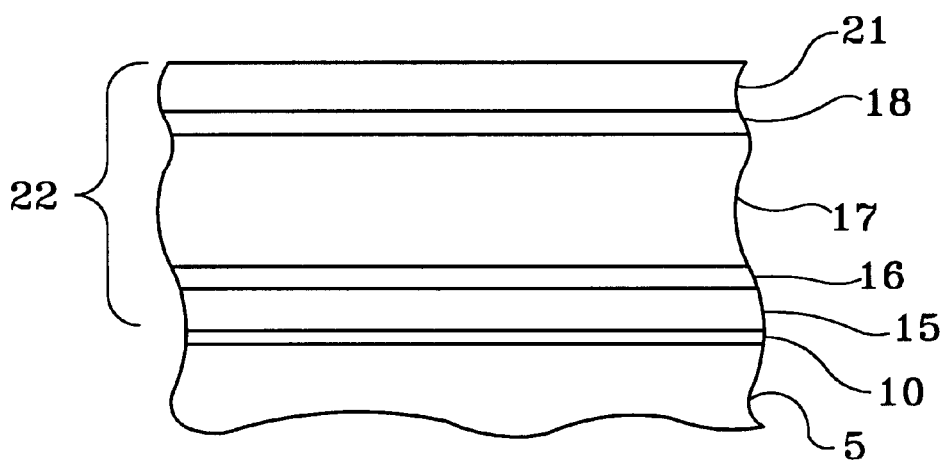

(5) FIG. 5 is a cross-sectional view of the features resulting from an ordered process having a capping layer comprising graded Cu—Zn alloy layers, in accordance with the present invention.

Figure 6:
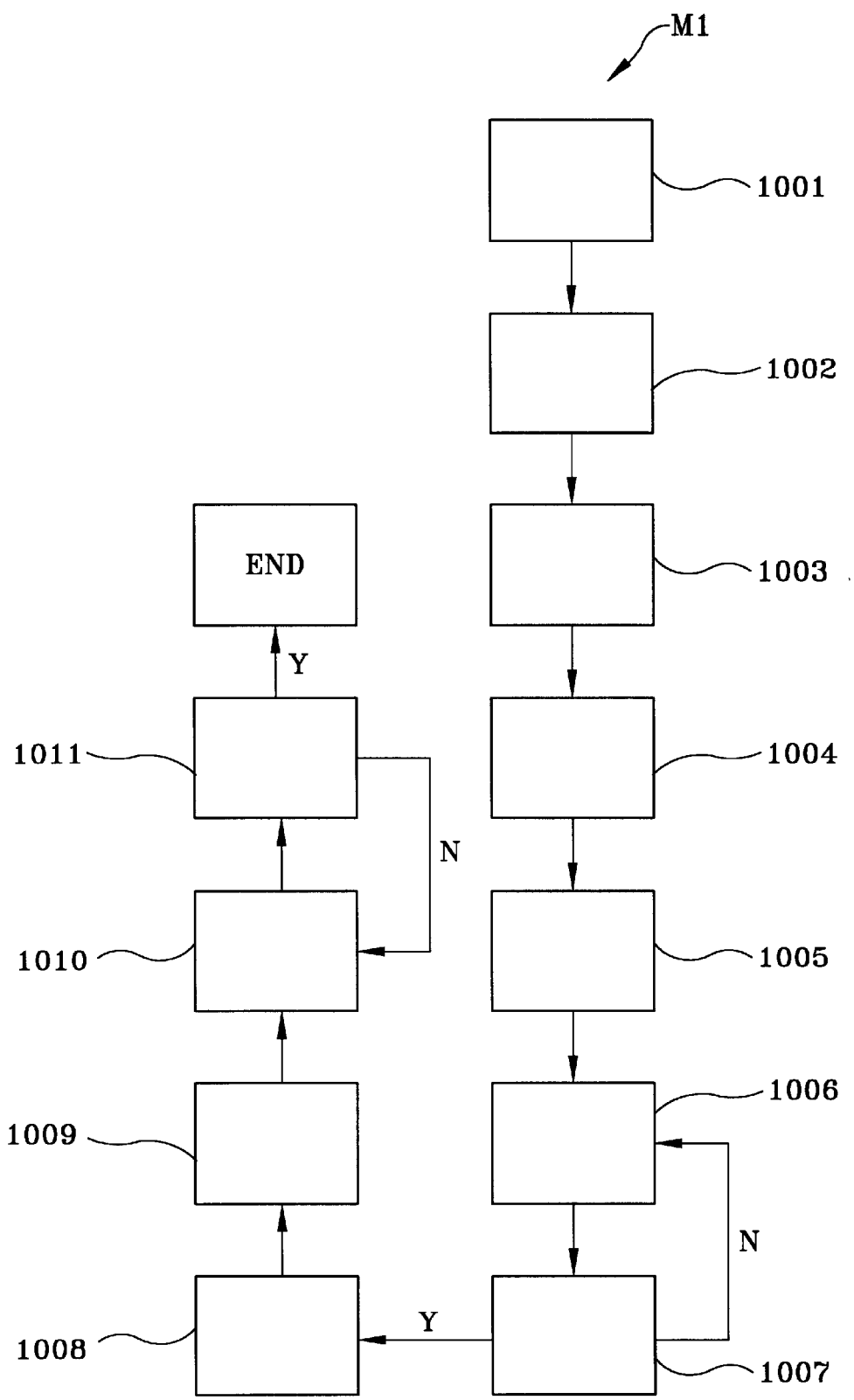

(6) FIG. 6 is a flowchart of a method for synthesizing a unique nontoxic aqueous Cu—Zn electroplating (chemical) solution, in accordance with the present invention.

Figure 7:
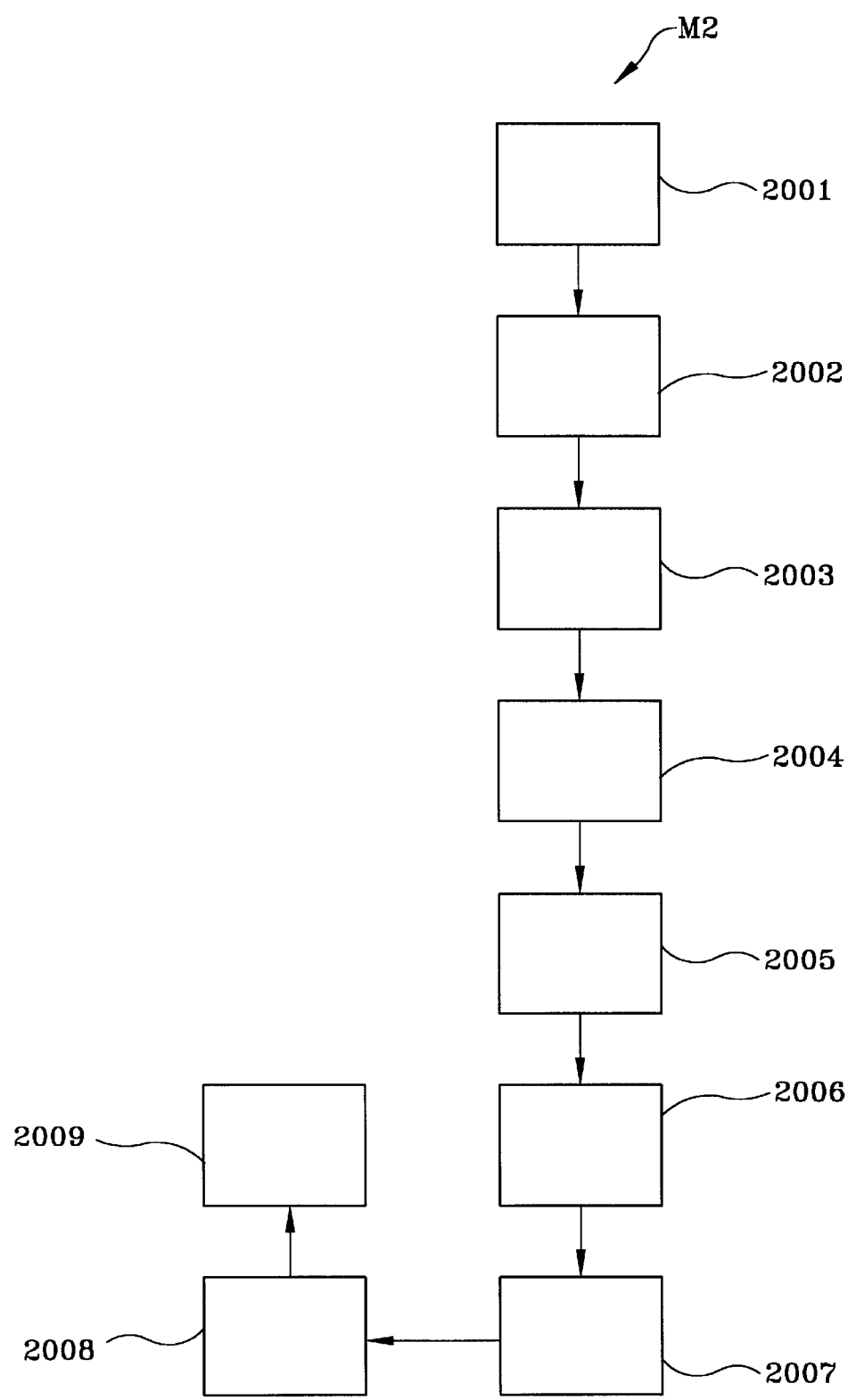

(7) FIG. 7 is a flowchart of a method for forming a graded Cu—Zn alloy fill on a Cu surface, in accordance with the present invention.

Figure 8:
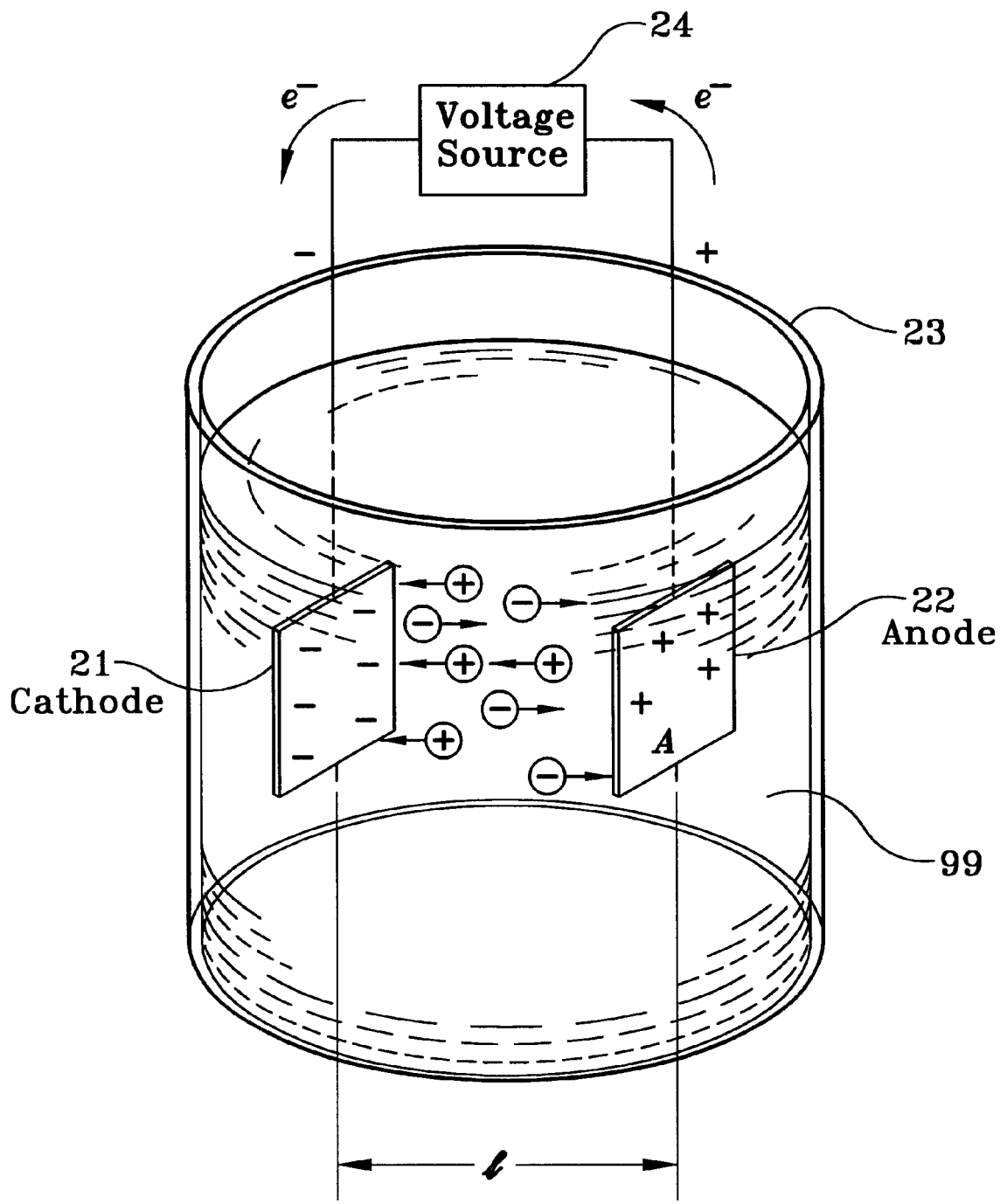

(8) FIG. 8 is a perspective view of an electroplating apparatus using the unique nontoxic aqueous Cu—Zn chemical solution, in accordance with the present invention.

DETAILED DESCRIPTION OF THE INVENTION

FIG. 1 illustrates, by example only, in cross-section, a Cu interconnect line 3 formed on a semiconductor substrate 4 and acting as the bottom portion of a via 6, the via 6 sidewalls comprising at least one low dielectric constant layer 8, in a dielectric constant range of approximately 1.6 to approximately 2.3, the via 6 having an optional barrier layer 10 formed by a technique such as chemical vapor deposition (CVD) or atomic layer deposition (ALD), comprising at least one material selected from a group consisting essentially of titanium silicon nitride ($Ti_xSi_yN_z$), tantalum nitride (TaN), tungsten nitride ($W_xN_y$), tantalum silicon nitride ($Ta_xSi_yN_z$), titianium carbide (TiC), tantalum carbide (TaC), and tungsten carbide (WC) in a thickness range of approximately 30 Å to approximately 50 Å (preferably having a thickness of approximately 30 Å), formed therein, an optional underlayer 19, comprising at least one material selected from a group consisting essentially of tin (Sn) and palladium (Pd) and having a thickness range of approximately 15 Å to approximately 50 Å (preferably approximately 30 Å), formed on the optional barrier layer 10, a Cu surface (e.g., a Cu—Zn alloy seed layer) 20 in a thickness range of approximately 100 Å to approximately 300 Å, formed on the optional underlayer 19, and a graded Cu—Zn alloy fill 30 comprising portions 30a, 30b, and 30c, formed in the via and on the Cu surface, wherein the portion 30a has a thickness of approximately 300 Å and a Zn content of approximately 1 at. %, wherein the portion 30b has a thickness of approximately 300 Å and a Zn content in a range of approximately 0.2 at. % to approximately 0.4 at. %, wherein the portion 30c has a thickness range of approximately 0.2 μm to 0.5 μm and a Zn content of approximately 0 at. %, in accordance with the present invention.

FIG. 2 illustrates, in cross-section, the features of FIG. 1, wherein the graded Cu—Zn alloy fill 30 has been annealed in a temperature range of approximately 150° C. to approximately 350° C. in the via 6 and on the Cu-surface 20, thereby extending the Cu—Zn alloy fill 30 through the Cu surface 20 via Zn-diffusion, thereby intermixing the alloy fill 30 with the Sn and/or Pd from the optional underlayer 19, and thereby forming very strong interfaces, especially with the optional barrier layer 10, wherein the portion 30a has a reduced Zn content range of approximately 0.5 at. % to approximately 1 at. %, wherein the portion 30b has a slightly increased Zn content range of approximately 0.2 at. % to approximately 0.5 at. %, wherein the portion 30c has a slightly increased Zn content range of approximately less than 0.2 at. %, in accordance with the present invention. With respect to the very strong interfacial layers, they are formed in the following configuration: a graded Cu—Zn alloy fill 30; a Cu—Zn—Sn—Pd alloy layer 29; and the optional barrier layer 10.

FIG. 3 illustrates, in cross-section, the features of FIG. 2, after planarization, by a technique such as chemical mechanical polishing (CMP) or electropolishing, thereby removing sufficient conductive material from the surface to form a graded Cu—Zn alloy fill dual-inlaid interconnect structure 35, and thereby forming a planarized surface 36, and in accordance with the present invention.

FIG. 4 illustrates, in cross-section, the features of FIG. 3, wherein a mixed layer 29' comprises the optional underlayer 19 and the Cu—Zn—Sn—Pd alloy layer 29, in accordance with the present invention.

FIG. 5 illustrates, by example only, in cross-section, the features resulting from an ordered process having a capping layer 22, in accordance with the present invention. The capping layer 22 comprises a barrier layer 10 formed on a Cu and/or low dielectric material 5; a Cu—Zn alloy layer 15, having a Zn content in the range of approximately 0.2 at. % to approximately 2.0 at. %, formed on the barrier layer 10; a Cu—Zn alloy layer 16, having a Zn content in the range of approximately less than 0.2 at. %, formed on the Cu—Zn alloy layer 15; a Cu—Zn alloy layer 17 (midlayer), having a Zn content in the range less than that which is detectable, formed on the Cu—Zn alloy layer 16; a Cu—Zn alloy layer 18, having a Zn content in the range of approximately less than 0.2 at. %, formed on the Cu—Zn alloy layer 17 (midlayer); and a Cu—Zn alloy layer 21, having a Zn content in the range of approximately 0.2 at. % to approximately 2.0 at. %, may be formed on the Cu—Zn alloy layer 18. In essence, the midlayer 17 of the capping layer 22 has the lowest Zn content. Therefore, the remaining layers have an increasing Zn content away from the midlayer 17.

FIG. 6 flowcharts, by example only, a method M1 for synthesizing a liter of a unique nontoxic aqueous Cu—Zn electroplating (chemical) solution, in accordance with the present invention:

(1) cleaning a mixing vessel (e.g., a beaker) with dilute nitric acid ($HNO_3$) for approximately 5 minutes, as indicated by block 1001;

(2) rinsing the mixing vessel in deionized (DI) water for approximately 5 minutes to approximately 10 minutes and subsequently drying the mixing vessel, for instance, under a gaseous nitrogen ($GN_2$) flow, as indicated by block 1002;

(3) adding an initial volume of DI water (e.g., approximately 400 ml) to the mixing vessel, as indicated by block 1003;

(4) adding at least one Cu ion source for providing a plurality of Cu ions and stirring the at least one Cu ion source into the DI water for a duration in a range of approximately 5 minutes to approximately 10 minutes or until complete dissolution of the at least one Cu ion source in the DI water is achieved, as indicated by block 1004;

(5) adding at least one complexing agent for complexing the plurality of Cu ions and stirring the at least one complexing agent until complete dissolution of the at least one complexing agent in the DI water is achieved, as indicated by block 1005;

(6) adding at least one pH adjuster and stirring the at least one pH adjuster into the DI water for a duration in a range of approximately 5 minutes to approximately 10 minutes or until a clean and transparent solution is achieved, as indicated by block 1006;

(7) measuring the pH of the solution, and, if the pH is within the desired range, proceeding to step (8), otherwise titrating the solution with a small volume of the at least one pH adjuster until the pH falls within the desired range, in essence, returning to step (6), as indicated by block 1007;

(8) adding at least one Zn ion source for providing a plurality of Zn ions and stirring the at least one Zn ion source into the DI water for a duration in a range of approximately 5 minutes to approximately 10 minutes or until complete dissolution of the at least one Zn ion source in the DI water is achieved, as indicated by block 1008;

(9) adding a final volume of DI water (e.g., effecting approximately 1 L in total solution volume) to the mixing vessel, as indicated by block 1009;

(10) optionally adding at least one complexing agent for complexing the plurality of Zn ions and stirring the at least one complexing agent until complete dissolution of the at least one complexing agent in the DI water is achieved, as indicated by block 1010; and

(11) measuring the pH of the solution, and, if the pH is within the desired range, terminating the synthesis, otherwise further titrating the solution with a small volume of the at least one pH adjuster until the pH falls within the desired range, in essence, returning to step (10), as indicated by block 1011.

In addition, the present invention chemical solution may be formulated as follows: wherein the at least one zinc (Zn) ion source comprises at least one zinc salt selected from a group consisting essentially of zinc acetate (($CH_3CO_2)_2Zn$), zinc bromide ($ZnBr_2$), zinc carbonate hydroxide ($ZnCO_3·2Zn(OH)_2$), zinc dichloride ($ZnCl_2$), zinc citrate (($O_2CCH_2C(OH)(CO_2)CH_2CO_2)_2Zn_3$), zinc iodide ($ZnI_2$), zinc L-lactate (($CH_3CH(OH)CO_2)_2Zn$), zinc nitrate ($Zn(NO_3)_2$), zinc stearate (($CH_3(CH_2)_{16}CO_2)_2Zn$), zinc sulfate ($ZnSO_4$), zinc sulfide ($ZnS$), zinc sulfite ($ZnSO_3$), and their hydrates (preferably zinc chloride or zinc dichloride and zinc citrate), wherein the optional at least one complexing agent for complexing the plurality of Zn ions comprises tartaric acid ($HO_2CCH(OH)CH(OH)CO_2H$), wherein the tartaric acid prevents precipitation of the plurality of Zn ions from the chemical solution, wherein the at least one copper (Cu) ion source comprises at least one copper salt selected from a group consisting essentially of copper(I) acetate ($CH_3CO_2Cu$), copper(II) acetate (($CH_3CO_2)_2Cu$), copper(I) bromide (CuBr), copper(II) bromide ($CuBr_2$), copper(II) hydroxide ($Cu(OH)_2$), copper(II) hydroxide phosphate ($Cu_2(OH)PO_4$), copper(I) iodide (CuI), copper(II) nitrate hydrate (($CuNO_3)_2$), copper(II) sulfate ($CuSO_4$), copper(I) sulfide ($Cu_2S$), copper(II) sulfide (CuS), copper(II) tartrate ((CH(OH)CO_2)_2Cu$), and their hydrates (preferably copper sulfate), wherein the at least one complexing agent for the plurality of Cu ions comprises at least one species selected from a group consisting essentially of ethylene diamine "EDA" ($H_2NCH_2CH_2NH_2$) and ethylenediaminetetraacetic acid "EDTA" (($HO_2CCH_2)_2NCH_2CH_2N(CH_2CO_2H)_2$), wherein the EDTA prevents precipitation of the plurality of Cu ions from the chemical solution, wherein the at least one pH adjuster comprises at least one pH-adjusting compound selected from a group consisting essentially of ammonium hydroxide ($NH_4OH$) and tetramethylammonium hydroxide "TMAH" (($CH_3)_4NOH$), wherein the at least one wetting agent comprises a surfactant, and wherein the surfactant comprises at least one surfactant selected from a group consisting essentially of RE-610™ and polyethylene glycol (PEG).

In the preferred embodiment of the chemical solution, the composition of the method M1 is formulated with component concentration ranges as follows: wherein the at least one zinc (Zn) ion source is provided in a concentration range of approximately 5 g/L to approximately 10 g/L (preferably approximately 10 g/L), wherein the at least one complexing agent for complexing the plurality of Zn ions is provided in a concentration range of approximately 10 g/L to approximately 30 g/L (preferably approximately 20 g/L), wherein the at least one copper (Cu) ion source is provided in a concentration range of approximately 5 g/L to approximately 20 g/L (preferably approximately 10 g/L), wherein the at least one complexing agent for complexing the plurality of Cu ions is provided in a concentration range of approximately 40 g/L to approximately 100 g/L (preferably approximately 80 g/L), wherein the at least one pH adjuster is provided in a concentration range of approximately 10 g/L to approximately 20 g/L (preferably approximately 15 g/L), wherein the at least one wetting agent is provided in a concentration range of approximately 0.01 g/L to approximately 0.1 g/L (preferably approximately 0.02 g/L), wherein the volume of water is provided in a volume range of up to and including approximately 1 L, wherein the solution flow rate is in a range of approximately less than 3 L/min, wherein the solution stir rate is in a range of approximately less than 700 rpm, and wherein the wafer rotation rate is in a range of approximately less than or equal to 700 rpm.

Also, the preferred embodiment involves the following process parameters ranges: wherein the at least one pH adjuster adjusts the chemical solution to a pH range of approximately 7 to approximately 14 (preferably in a pH range of approximately 10 to approximately 12), wherein the chemical solution may be maintained in a temperature range of approximately 16° C. to approximately 35° C. (preferably at a temperature of approximately 24° C.), and wherein the Cu surface 20 is electroplated for a duration in a range of approximately 30 seconds to approximately 120 seconds (preferably for a duration of approximately 60 sec).

FIG. 7 flowcharts, by example only, a method M2 of fabricating a semiconductor device, having a graded reduced-oxygen copper-zinc (Cu—Zn) alloy fill 30 formed on a copper (Cu) surface 20, the Cu surface 20 (e.g., a Cu—Zn ally seed layer) having been formed by atomic layer deposition (ALD), atomic layer chemical vapor deposition (ALCVD), self-ionized plasma (SIP), hollow cathode magnetron (HCM), ion metal plasma (IMP), chemical vapor deposition (CVD), plasma vapor deposition (PVD), plasma-enhanced vapor deposition (PECVD), electroless plating, or electroplating and optionally annealing the Cu surface 20 in a temperature range of approximately 150° C. to approximately 250° C., the graded alloy fill 30 formed by electroplating the Cu surface 20 in a chemical solution, initially comprising the steps of: providing a semiconductor substrate 4 having a Cu surface 20, an optional barrier layer 10, and an optional underlayer 19 formed in a via 6, as indicated by block 2001; providing a chemical solution, the chemical solution comprising: at least one zinc (Zn) ion source for providing a plurality of Zn ions; at least one copper (Cu) ion source for providing a plurality of Cu ions; at least one complexing agent for complexing the plurality of Cu ions; at least one pH adjuster; at least one wetting agent for stabilizing the chemical, all being dissolved in a volume of deionized (DI) water, as shown by block 2002; electroplating the Cu surface 20 in the chemical solution, wherein the electroplating parameters, such as current density, solution flow rate (hydrodynamic conditions), temperature, and spacing between the anode and the wafer (i.e., the current density being variable by mechanical adjustment), are varied in situ to effect the desired Zn-content gradient in the alloy fill, thereby forming a graded Cu—Zn alloy fill 30 in the via 6 and on the Cu surface 20, as indicated by block 2003; rinsing the graded Cu—Zn alloy fill 30 in a solvent, as indicated by block 2004; drying the graded Cu—Zn alloy fill 30 under a gaseous flow, for instance, under a gaseous nitrogen flow ($GN_2$), as indicated by block 2005; annealing the graded alloy fill layer 30 formed in the via 6 and on the Cu surface 20 in a temperature range such as 150° C. to 450° C. (preferably in a temperature of approximately 150° C. to approximately 350° C.), wherein the annealing step is performed for a duration range of approximately 0.5 minutes to approximately 60 minutes, thereby reducing the oxygen impurity concentration to a level less than that which is detectable (i.e., ~0.1 at. %) in the graded alloy fill layer 30, thereby modifying the grain structure by increasing the grain size of both the graded alloy fill layer 30 as well as the Cu surface 20, and thereby forming a mixed interface comprising the Cu—Zn—Sn—Pd alloy layer 29, thereby forming a graded reduced-oxygen Cu—Zn alloy fill 30, as indicated by block 2006; planarizing, by a technique such as chemical mechanical polishing (CMP) and electropolishing, the graded reduced-oxygen Cu—Zn alloy fill 30, the Cu surface 20, the optional barrier layer 10, and the optional underlayer 19, as indicated by block 2007; further annealing the planarized graded reduced-oxygen Cu—Zn alloy fill 30, the Cu surface 20, the optional barrier layer 10, and the optional underlayer 19 in a temperature range of approximately 150° C. to approximately 350° C., thereby completing formation of a graded Cu—Zn filled dual-inlaid interconnect structure 35, and thereby forming the planarized surface 36, as indicated by block 2008; and completing formation of the semiconductor device, as indicated by block 2009. The annealing step also facilitates doping of the graded Cu—Zn alloy fill 30 with desirable Sn and Pd impurities from the underlayer 19 which structurally stabilizes the graded alloy fill 30 by internally increasing its bond strengths. Optionally, this method M2 may also further comprise the step of forming a graded capping layer 36 on an upper surface of the graded dual inlaid interconnect 35, wherein the capping layer 36 Zn-content is lower at the upper surface of the graded dual inlaid interconnect 35 and the capping layer 36 Zn-content is higher at a capping layer 36 outer surface. The chemical solution may further comprise at least one complexing agent for complexing the plurality of Zn ions also being dissolved in the volume of DI water.

FIG. 8 illustrates, in perspective view, an electroplating apparatus using the unique nontoxic aqueous Cu—Zn chemical solution, in accordance with the present invention. In particular, the electroplating step (3) of FIG. 3 may be performed in this electroplating apparatus comprising: (a) a cathode-wafer 21; (b) an anode 22; (c) an electroplating vessel 23 such as a beaker; and (d) a voltage source 24. The cathode-wafer 21 may comprise a Cu surface 20. The anode 22 may comprise at least one material selected from a group consisting essentially of copper (Cu), a copper-platinum alloy (Cu—Pt), titanium (Ti), platinum (Pt), a titanium-platinum alloy (Ti—Pt), anodized copper-zinc alloy (Cu—Zn, i.e., brass), and platinized titanium (Pt/Ti), and platinized copper-zinc (Pt/Cu—Zn, i.e., platinized brass). The brass alloy may be anodized to form a thin oxide film in situ using the chemical solution 99 prior to electroplating the cathode-wafer 21. The anodized brass anode also provides the following benefits: (1) a uniform current density distribution on the cathode-wafer; (2) a graded Cu—Zn alloy fill formation, (3) a uniform Zn distribution across the graded Cu—Zn alloy fill surface, and (4) a graded Zn distribution across the Cu—Zn alloy fill thickness. The present invention electroplating method also comprises direct voltage in the range of approximately 1 V to approximately 4 V (preferably in a voltage range of approximately 1 V to approximately 2 V); and a direct current in the range of approximately 0.01 A to approximately 0.2 A (preferably in a current range of approximately 0.1 A to approximately 0.15 A). Differential pulse conditions selected from a group consisting essentially of forward pulses, reverse pulses, combinations of forward and reverse pulses, combinations of direct current, and combinations of direct voltage may also be applied.

Further, the Zn-doping in the resultant graded Cu—Zn alloy fill 30 may be controlled in the present invention by varying electroplating conditions. For example, increasing the at least one zinc (Zn) ion source 40 concentration slowly increases Zn-doping, increasing the at least one copper (Cu) ion source 60 concentration slowly decreases Zn-doping, increasing the solution flow rate increases Zn-doping, increasing the pH decreases cathodic efficiency with respect to Zn and thereby decreases Zn-doping, increasing the electroplating duration slowly decreases Zn-doping, using a Cu anode decreases Zn-doping, using a brass anode increases Zn-doping, increasing the voltage increases the Zn-doping, and increasing the current increases the Zn-doping.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A method of fabricating a semiconductor device, having a graded reduced-oxygen copper-zinc (Cu—Zn) alloy filled dual-inlaid interconnect structure formed on a copper (Cu) surface formed by electroplating the Cu surface in a chemical solution, comprising the steps of:

providing a semiconductor substrate having a Cu surface formed in a via;

providing a chemical solution;

electroplating the Cu surface in the chemical solution while varying at least one electroplating parameter selected from a group consisting essentially of current density, solution flow rate (hydrodynamic conditions), temperature, and spacing between the anode and the wafer in situ, thereby varying a local Zn concentration in said chemical solution at the Cu surface, and thereby forming a graded Cu—Zn alloy fill in the via and on the Cu surface;

rinsing the graded Cu—Zn alloy fill in a solvent;

drying the graded Cu—Zn alloy fill under a gaseous flow;

annealing the graded Cu—Zn alloy fill formed in the via and on the Cu surface, thereby forming a graded reduced-oxygen Cu—Zn alloy fill;

planarizing the graded reduced-oxygen Cu—Zn alloy fill and the Cu surface, thereby completing formation of a graded reduced-oxygen Cu—Zn alloy filled dual-inlaid interconnect structure; and completing formation of the semiconductor device.

2. A method, as recited in claim 1, wherein the chemical solution is nontoxic and aqueous, and wherein the chemical solution comprises:

at least one zinc (Zn) ion source for providing a plurality of Zn ions;

at least one copper (Cu) ion source for providing a plurality of Cu ions;

at least one complexing agent for complexing the plurality of Cu ions;

at least one pH adjuster;

at least one wetting agent for stabilizing the chemical solution, all being dissolved in a volume of deionized (DI) water.

3. A method, as recited in claim 2, wherein the at least one zinc (Zn) ion source comprises at least one zinc salt selected from a group consisting essentially of zinc acetate (($CH_3CO_2$)$_2$Zn), zinc bromide ($ZnBr_2$), zinc carbonate hydroxide ($ZnCO_3 \cdot 2Zn(OH)_2$), zinc dichloride ($ZnCl_2$), zinc citrate (($O_2CCH_2C(OH)(CO_2)CH_2CO_2$)$_2$Zn$_3$), zinc iodide ($ZnI_2$), zinc L-lactate (($CH_3CH(OH)CO_2$)$_2$Zn), zinc nitrate ($Zn(NO_3)_2$), zinc stearate (($CH_3(CH_2)_{16}CO_2$)$_2$Zn), zinc sulfate ($ZnSO_4$), zinc sulfide ($ZnS$), zinc sulfite ($ZnSO_3$), and their hydrates.

4. A method, as recited in claim 2, wherein the at least one copper (Cu) ion source comprises at least one copper salt selected from a group consisting essentially of copper(I) acetate ($CH_3CO_2Cu$), copper(II) acetate (($CH_3CO_2$)$_2$Cu), copper(I) bromide (CuBr), copper(II) bromide ($CuBr_2$), copper(II) hydroxide ($Cu(OH)_2$), copper(II) hydroxide phosphate ($Cu_2(OH)PO_4$), copper(I) iodide (CuI), copper(II) nitrate (($CuNO_3$)$_2$), copper(II) sulfate ($CuSO_4$), copper(I) sulfide ($Cu_2S$), copper(II) sulfide (CuS), copper(II) tartrate (($CH(OH)CO_2$)$_2$Cu), and their hydrates.

5. A method, as recited in claim 1,
wherein said electroplating step comprises using an electroplating apparatus, and
wherein said electroplating apparatus comprises:
(a) a cathode-wafer;
(b) an anode;
(c) an electroplating vessel; and
(d) a voltage source.

6. A method, as recited in claim 5,
wherein the cathode-wafer comprises the Cu surface, and
wherein the anode comprises at least one material selected from a group consisting essentially of copper (Cu), a copper-platinum alloy (Cu—Pt), titanium (Ti), platinum (Pt), a titanium-platinum alloy (Ti—Pt), an anodized copper-zinc alloy (Cu—Zn, i.e., brass), a platinized titanium (Pt/Ti), and a platinized copper-zinc (Pt/Cu—Zn, i.e., platinized brass).

7. A method, as recited in claim 1,
wherein said semiconductor substrate further comprises a barrier layer formed in the via under said Cu surface, and
wherein the barrier layer comprises at least one material selected from a group consisting essentially of titanium silicon nitride ($Ti_xSi_yN_z$), tantalum nitride (TaN), tungsten nitride ($W_xN_y$), tantalum silicon nitride ($Ta_xSi_yN_z$), titanium carbide (TiC), tantalum carbide (TaC), and tungsten carbide (WC).

8. A method, as recited in claim 7,
wherein said semiconductor substrate further comprises an underlayer formed on the barrier layer,
wherein said underlayer comprises at least one material selected from a group consisting essentially of tin (Sn) and palladium (Pd), and
wherein said Cu surface is formed over said barrier layer and on said underlayer.

9. A method, as recited in claim 8,
wherein said underlayer comprises a thickness range of approximately 15 Å to approximately 50 Å,
wherein said barrier layer comprises a thickness range of approximately 30 Å to approximately 50 Å,
wherein said Cu surface comprises a thickness range of approximately 100 Å to approximately 300 Å, and
wherein said graded Cu—Zn alloy fill comprises at least one portion, said at least one portion comprising a thickness range of approximately 300 Å.

10. A method, as recited in claim 1,
wherein the annealing steps are performed in a temperature range of approximately 150° C. to approximately 450° C., and
wherein the annealing steps are performed for a duration range of approximately 0.5 minutes to approximately 60 minutes.

11. A semiconductor device, having a graded reduced-oxygen copper-zinc (Cu—Zn) alloy filled dual-inlaid interconnect structure formed on a copper (Cu) surface formed by electroplating the Cu surface in a chemical solution, fabricated by a method comprising the steps of:

providing a semiconductor substrate having a Cu surface formed in a via;

providing a chemical solution;

electroplating the Cu surface in the chemical solution while varying at least one electroplating parameter selected from a group consisting essentially of current density, solution flow rate (hydrodynamic conditions), temperature, and spacing between the anode and the wafer in situ,
thereby varying a local Zn concentration in said chemical solution at the Cu surface, and
thereby forming a graded Cu—Zn alloy fill in the via and on the Cu surface;

rinsing the graded Cu—Zn alloy fill in a solvent;

drying the graded Cu—Zn alloy fill under a gaseous flow;

annealing the graded Cu—Zn alloy fill formed in the via and on the Cu surface, thereby forming a graded reduced-oxygen Cu—Zn alloy fill;

planarizing the graded reduced-oxygen Cu—Zn alloy fill and the Cu surface, thereby completing formation of a graded reduced-oxygen Cu—Zn alloy filled dual-inlaid interconnect structure; and completing formation of the semiconductor device.

12. A device, as recited in claim 11,
wherein the chemical solution is nontoxic and aqueous, and
wherein the chemical solution comprises:
at least one zinc (Zn) ion source for providing a plurality of Zn ions;
at least one copper (Cu) ion source for providing a plurality of Cu ions;
at least one complexing agent for complexing the plurality of Cu ions;
at least one pH adjuster;
at least one wetting agent for stabilizing the chemical solution, all being dissolved in a volume of deionized (DI) water.

13. A device, as recited in claim 12, wherein the at least one zinc (Zn) ion source comprises at least one zinc salt selected from a group consisting essentially of zinc acetate (($CH_3CO_2$)$_2$Zn), zinc bromide ($ZnBr_2$), zinc carbonate hydroxide ($ZnCO_3 \cdot 2Zn(OH)_2$), zinc dichloride ($ZnCl_2$), zinc citrate (($O_2CCH_2C(OH)(CO_2)CH_2CO_2$)$_2$Zn$_3$), zinc iodide ($ZnI_2$), zinc L-lactate (($CH_3CH(OH)CO_2$)$_2$Zn), zinc nitrate ($Zn(NO_3)_2$), zinc stearate (($CH_3(CH_2)_{16}CO_2$)$_2$Zn), zinc sulfate ($ZnSO_4$), zinc sulfide ($ZnS$), zinc sulfite ($ZnSO_3$), and their hydrates.

14. A device, as recited in claim 12, wherein the at least one copper (Cu) ion source comprises at least one copper salt selected from a group consisting essentially of copper(I)

acetate ($CH_3CO_2Cu$), copper(II) acetate (($CH_3CO_2)_2Cu$), copper(I) bromide (CuBr), copper(II) bromide ($CuBr_2$), copper(II) hydroxide ($Cu(OH)_2$), copper(II) hydroxide phosphate ($Cu_2(OH)PO_4$), copper(I) iodide (CuI), copper(II) nitrate hydrate (($CuNO_3)_2$), copper(II) sulfate ($CuSO_4$), copper(I) sulfide ($Cu_2S$), copper(II) sulfide (CuS), copper (II) tartrate (($CH(OH)CO_2)_2Cu$), and their hydrates.

15. A device, as recited in claim 11,
wherein said electroplating step comprises using an electroplating apparatus, and
wherein said electroplating apparatus comprises:
(a) a cathode-wafer;
(b) an anode;
(c) an electroplating vessel; and
(d) a voltage source.

16. A device, as recited in claim 15,
wherein the cathode-wafer comprises the Cu surface, and
wherein the anode comprises at least one material selected from a group consisting essentially of copper (Cu), a copper-platinum alloy (Cu—Pt), titanium (Ti), platinum (Pt), a titanium-platinum alloy (Ti—Pt), an anodized copper-zinc alloy (Cu—Zn, i.e., brass), a platinized titanium (Pt/Ti), and a platinized copper-zinc (Pt/Cu—Zn, i.e., platinized brass).

17. A device, as recited in claim 11,
wherein said semiconductor substrate further comprises a barrier layer formed in the via under said Cu surface, and
wherein the barrier layer comprises at least one material selected from a group consisting essentially of titanium silicon nitride ($Ti_xSi_yN_z$), tantalum nitride (TaN), tungsten nitride ($W_xN_y$), tantalum silicon nitride ($Ta_xSi_yN_z$), titianium carbide (TiC), tantalum carbide (TaC), and tungsten carbide (WC).

18. A device, as recited in claim 17,
wherein said semiconductor substrate further comprises an underlayer formed on the barrier layer,
wherein said underlayer comprises at least one material selected from a group consisting essentially of tin (Sn) and palladium (Pd), and
wherein said Cu surface is formed over said barrier layer and on said underlayer.

19. A device, as recited in claim 18,
wherein said underlayer comprises a thickness range of approximately 15 Å to approximately 50 Å,
wherein said barrier layer comprises a thickness range of approximately 30 Å to approximately 50 Å,
wherein said Cu surface comprises a thickness range of approximately 100 Å to approximately 300 Å, and
wherein said graded Cu—Zn alloy fill comprises at least one portion, said at least one portion comprising a thickness range of approximately 300 Å.

20. A semiconductor device, having a graded reduced-oxygen copper-zinc (Cu—Zn) alloy filled dual-inlaid interconnect structure formed on a copper (Cu) surface using a chemical solution, comprising:
a semiconductor substrate having a via; and
a graded reduced-oxygen dual-inlaid interconnect structure formed and disposed in said via, said interconnect structure comprising:
at least one Cu surface formed and disposed in said via;
a graded reduced-oxygen Cu—Zn alloy fill formed and disposed on the at least one Cu surface,
said alloy fill comprising at least one portion having a Zn-content, and
said at least one portion Zn-content collectively defining a Zn-content gradient progressing from a lowest Zn-content at an interconnect structure center to a highest Zn-content at an interconnect structure outer bound.

* * * * *